United States Patent [19]

Hunt et al.

[11] 4,210,863
[45] Jul. 1, 1980

[54] EXTENDIBLE PROBE FOR USE WITH TEST INSTRUMENTS

[75] Inventors: Bill Hunt, Snohomish; Dean R. Merriman, Mukilteo, both of Wash.

[73] Assignee: Huntron Instruments, Inc., Seattle, Wash.

[21] Appl. No.: 17,263

[22] Filed: Mar. 5, 1979

Related U.S. Application Data

[63] Continuation of Ser. No. 781,874, Mar. 28, 1977, abandoned.

[51] Int. Cl.² ............................................. G01R 31/02
[52] U.S. Cl. .................................... 324/72.5; 279/42; 339/108 TP
[58] Field of Search ...................... 339/108 TP, 97 T; 279/42; 324/72.5, 149, 158 P, 158 F

[56] References Cited

U.S. PATENT DOCUMENTS

| | | | |
|---|---|---|---|
| 951,631 | 3/1910 | Dake | 339/108 TP |
| 1,650,779 | 11/1927 | Williams | 324/72.5 |
| 1,713,971 | 5/1929 | Lowry et al. | 339/108 TP |
| 2,400,285 | 5/1946 | Buck | 279/42 |
| 3,799,168 | 3/1974 | Peters | 339/108 TP |

*Primary Examiner*—Michael J. Tokar
*Attorney, Agent, or Firm*—Cole, Jensen & Puntigam

[57] ABSTRACT

An extendible probe comprising an electrode and a body having two parts which cooperate to clamp the electrode in a desired position. The electrode comprises an elongated length of small diameter, electrically conducting, non-corrosive material which is electrically insulated except for the tip of one end, which is exposed and formed to a point. The two-part body has a longitudinal opening therethrough, which receives the electrode. The front part of the body, referred to as the tip, includes a tapered collett which extends away from the rear end thereof and which is compressed under pressure against the electrode, which passes therethrough. The rear part of the body, referred to as the barrel, overlays the collett and threadably engages the tip of the body. This arrangement permits controlled longitudinal movement of the barrel relative to the tip of the body. A tapered portion of the interior wall of the barrel is configured to mate with the collett, and when the barrel and tip are operatively joined, the tapered portion contacts the collett. The amount of pressure applied to the collett depends upon the relative longitudinal relationship between the barrel and tip of the body.

10 Claims, 1 Drawing Figure

EXTENDIBLE PROBE FOR USE WITH TEST INSTRUMENTS

This is a continuation of application Ser. No. 781,874, filed Mar. 28, 1977 and now abandoned.

BACKGROUND OF THE INVENTION

This invention relates generally to the art of test instruments and accessories therefore, and more particularly concerns probes for electrical test instruments.

Virtually all instruments which test the condition of electronic components and/or circuits, such as VOM meters, oscilloscopes, and transistor checkers, use test probes, which act as an interface between the element or circuit point to be tested and the test instrument.

Typically, such test probes are somewhat elongated and include an insulated case or body which the operator holds, and an electrode, usually in the form of a small exposed tip, which is connected to a test lead. The test lead in turn is connected to the test instrument. In operation, the electrode is guided by the operator to the point in the circuit or to the component which is to be tested.

In many applications, however, conventional test probes are either inconvenient to use or even unsuitable. They are often too bulky to use with crowded circuits and often cause shorting when they contact other circuit points. Some probes have been provided with extended tips but these probes have been found to be cumbersome to operate and, because of their length, are inconvenient to store when not in use and are susceptible to breakage and/or damage. Furthermore, it has been found that conventional probes are susceptible to corrosion, which alters the signals being measured and thus impairs the accuracy of the total measuring system.

Accordingly, it is a general object of the present invention to provide a probe for electrical test instruments which overcomes the disadvantages of the prior art discussed above.

It is another object of the present invention to provide such an instrument probe having an electrode which may be conveniently extended and retracted from a probe body.

It is a further object of the present invention to provide such an instrument probe having an electrode which can be safely and conveniently used in a very cramped circuit environment, yet is compact for storage.

It is an additional object of the present invention to provide such an instrument probe which is safe for the operator to use.

It is yet another object of the present invention to provide such an instrument probe which does not alter or disguise the signal or other circuit condition being measured.

It is a still further object of the present invention to provide such an instrument probe having an extendible/retractable electrode which may be conveniently and reliably clamped in position.

It is an additional object of the present invention to provide such an instrument probe which is convenient to manufacture and simple to use.

It is yet another object of the present invention to provide such an instrument probe having an electrode which comprises a material which is non-corrosive, capable of holding a sharp point over an extended period of time, and which rebounds to its original configuration after any pressure thereon is relieved.

SUMMARY OF THE INVENTION

Accordingly, the present invention includes an elongated, small-diameter electrode and a two-part probe body having an opening therethrough adapted to receive the electrode, and to permit movement of the electrode between an extended position and a retracted position relative to the body. The electrode is electrically insulated along its length except for a small region about one end thereof, such that when the electrode is in its extended position, it is suitable for convenient operative contact with a selected circuit point in a crowded circuit, without causing shorting with adjacent components. The first, or tip part of the body includes a projection at the rear end thereof through which the electrode is free to move. The projection is so configured and arranged that it compresses under external pressure. The second, or barrel part of the body has a forward portion which overlays the projection and engages the tip part in such a manner that the barrel part may be controllably moved relative to the tip part. The barrel part has an interior wall which includes a first region which in turn contacts the projection when the barrel part engages the tip part. The first region of the interior wall has such a configuration, relative to the configuration of the projection, that movement of the barrel part relative to the tip part in a first longitudinal direction results in an increase in external pressure being applied to the projection, forcing it tight against the electrode, thereby clamping the electrode in place. Further, movement of the barrel part relative to the tip part in a second longitudinal direction opposite to the first results in a decrease in external pressure on the projection, releasing it from the electrode, thereby permitting the electrode to be freely moved into a desired position relative to the body by an operator.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figure 1:
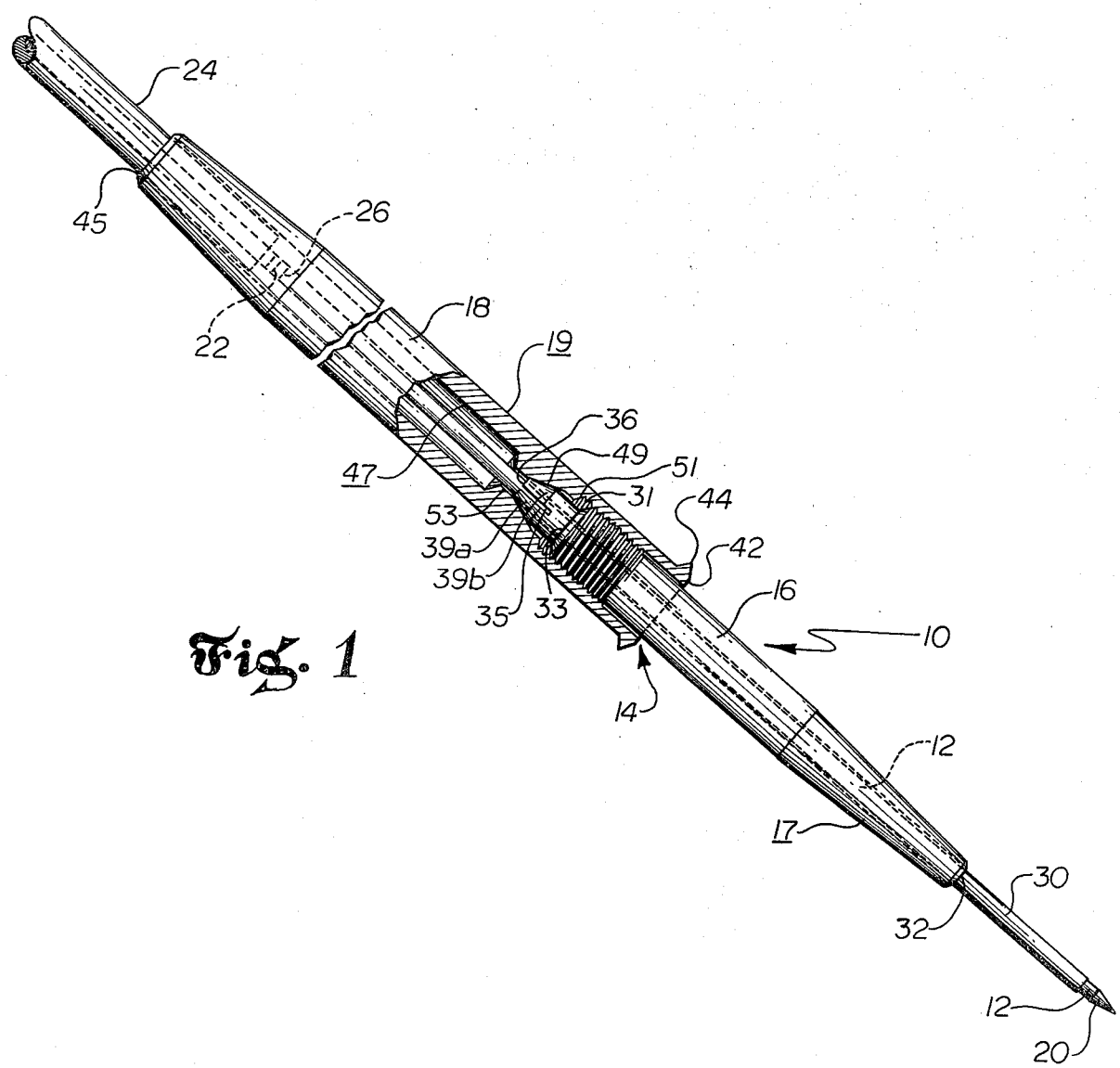
FIG. 1 is a side view, partially cross-sectioned, of the test probe of the present invention, showing the electrode portion of the probe partially extended relative to the barrel.

Referring to FIG. 1, the test probe of the present invention shown generally at 10 comprises a small-diameter, elongated electrode 12, and a body shown generally at 14, which comprises a front part 16, referred to as the tip, and a rear part 18, referred to as the barrel, which threadably engage each other.

Body 14 has a central bore or opening formed longitudinally therein, which receives electrode 12. The forward end 20 of electrode 12 is free, for contact with the desired circuit point or element, while the rear end 22 thereof is connected to a conventional test lead 24, which in turn is connected to a test instrument (not shown), such as a voltmeter, oscilloscope, or the like.

The structure and configuration of body 14 and electrode 12, and their operative relationship, permits electrode 12 to be extended and retracted from body 14 and to be clamped in any desired position therebetween. As will be explained in more detail in following paragraphs, electrode 12 is clamped in position when barrel 18 of body 14 is in a particular longitudinal position relative to tip 16 thereof. When barrel 18 is then moved relative to tip 16 in a particular manner to be described hereinafter, the clamping pressure on electrode 12 is released, permitting electrode 12 to be moved to a different position and then reclamped.

Electrode 12 is a small-diameter, elongated length of rigid, electrically conducting material, the forward end 20 of which is shaped to a point for purposes of accurate contact between electrode 12 and the circuit point to be tested. Electrode 12 is sufficiently rigid to withstand minor lateral pressures occuring in normal testing procedures without bending, and further, when a lateral pressure is sufficient to bend the electrode, is sufficiently resilient to rebound to its original configuration, i.e. to resist permanent bending. The material comprising electrode 12 further is sufficiently hard that it maintains its sharp point for a considerable period of time, and is corrosion-resistant to insure long-term accuracy of results.

In the embodiment shown, electrode 12 is comprised of tempered stainless steel, has a diameter of 0.45 inches, and a length of 4.625 inches. The forward end 20 of electrode 12 is exposed for approximately ⅛th to ¼th of an inch. The rear end 22 of electrode 12 is electrically connected to insulated test lead 24 by conventional means, such as a crimp connection 26. Crimp connection 26 is at all times located within body 14, regardless of the position of electrode 12. Hence, the forward end of insulated test lead 24, which is connected to rear end 22 of electrode 12, at all times moves longitudinally in body 14, as electrode 12 is extended and retracted by the operator.

Electrode 12 is covered with a layer of insulation 30 from a point near the forward end 20 thereof to rear end 22 thereof. Insulation layer 30 protects other circuit components in proximity to the circuit point being tested, as well as the operator, from electrical contact with electrode 12. In the embodiment shown, insulated layer 30 is a powdered epoxy coating having a 1000 volt rating. The exterior diameter of electrode 12 with insulation layer 30 is 0.048 inches.

When electrode 12 is in its fully extended position, only the exposed forward end 20 is capable of making electrical contact with the component or circuit point to be tested. Since electrode 12 is small-diameter and insulated along its length except for forward end 20, remote or difficult-to-reach circuit components and circuit points may be conveniently contacted without resulting in electrical contact with other circuit points and thereby causing electrical shorting and subsequent circuit damage.

The two part body 14 is generally elongated, and otherwise configured so that it may be conveniently held and used by an operator. The material comprising barrel 14 in the embodiment shown is a fire resistant plastic, but other materials could conveniently be used.

The tip 16 of body 14 has a central opening running longitudinally thereof. In the embodiment shown, the central opening in tip 16 is uniform along its entire length, and has a diameter of 0.052 inches, which is sufficient to permit electrode 12, with its layer of insulation 30, to be received therein and to move between its extended and retracted positions.

The exterior wall 17 of tip 16 is generally circular in lateral cross-section throughout the length thereof. Referring to FIG. 1, tip 16 is shown in side view. From the front end 32 of tip 16, exterior wall 17 increases sharply in diameter, at approximately a 45° angle, over a longitudinal distance of approximately 1/32 of an inch, and then gradually increases in diameter from 0.110 inches to 0.182 inches over a longitudinal distance of 0.75 inches.

The diameter of tip 16 then remains uniform until very near the rear end 33 thereof. Approximately 0.3 inches of the uniform diameter region of tip 16 is threaded, permitting engagement of tip 16 with barrel 18. At the very rear of tip 16, the diameter thereof sharply decreases, in a tapered section 31, at an angle of about 45°, over a longitudinal distance of approximately 1/32 inch, where tapered section 31 intersects a collett shown generally at 34, which projects longitudinally away from rear end 33 of tip 16.

Collett 34 is generally circular in cross-section and maintains a uniform diameter of approximately 0.137 inches for a longitudinal distance of approximately ⅛th of an inch from rear end 33 of tip 16, whereupon collett 34 tapers at an angle within the range of 12° to 30°, and preferably approximately 20° to its free edge 36. The longitudinal distance of the tapered portion is approximately ⅛th inch, and the diameter of collett 34 at free edge 36 is approximately 0.076 inches.

Extending rearward of free edge 36 longitudinally toward tip 16 is a slot 35, which is approximately 1/32 wide and 0.150 inches long. Another slot (not shown), identical to slot 35, is provided in collett 34 approximately 180° removed from slot 35. The longitudinal slots in collett 34 divide the tapered portion thereof into upper and lower collett sections 39a, 39b.

Barrel 18 has an exterior wall 19 which is generally circular in lateral cross-section.

Extending around the circumference of the forward end 42 of barrel 18 is a small projection 44 which extends outwardly from the barrel at substantially a right angle thereto. Projection 44 narrows to a point at a diameter of 0.275 inches in the embodiment shown. Its width at its base is approximately ⅛th inch.

Exterior wall 19 has a substantially uniform diameter from the base of projection 44 to a point which is approximately 0.75 inches from the rear end 45 of barrel 18. The exterior diameter then begins to decrease gradually until it reaches 0.210 inches at a point very near rear end 45, at which point the exterior diameter decreases at approximately a 45° angle for approximately 1/32 inch.

Barrel 18 also has a central opening along its entire length, to receive electrode 12 and the insulated test lead 24. However, unlike tip 16, barrel 18 has an interior wall 47 of varying diameter. In the embodiment shown, interior wall 47 has an interior diameter of 0.183 inches at forward end 42. The interior diameter remains uniform for a distance of approximately 0.2 inches. In this region, there is a clearance of approximately 0.001 inches between interior wall 47 of barrel 18 and exterior wall 17 of tip 16.

The next 0.250 longitudinal inches of interior wall 47 is threaded to engage the corresponding threaded portion of tip 16. Hence, barrel 18 may be threaded onto tip 16, thus permitting a controlled longitudinal movement of barrel 18 relative to tip 16. At the end of the threaded portion of barrel 18, the interior diameter decreases for approximately 1/32 inch, thus forming an abutment or stop 51 which mates with tapered section 31 of exterior wall 17 at the rear end of tip 16. Stop 51 thus functions as a rear stop for tip 16.

The diameter of interior wall 47 remains uniform for a relatively short longitudinal distance, and then begins to taper inwardly for approximately 0.156 inches. This region 49 is tapered to make contact with the tapered portion of collett 34. Tapered region 49 is sufficiently long that it contacts the entire tapered portion of collett 34 over a relatively wide variance in the longitudinal relationship between tip and barrel parts 16 and 18, i.e. both when electrode 12 is free to move and when it is clamped.

Immediately succeeding tapered region 49 is a region of uniform diameter 53, which in the embodiment shown has a diameter of 0.052 inches, which is slightly larger than the diameter of the insulated electrode. The longitudinal dimension of region 53 is approximately 1/16 inch, which is sufficient to permit region 53 to function as a restraint for any lateral movement of electrode 12 at this longitudinal point in barrel 18.

Following region 53, the interior diameter of barrel 18 sharply increases to approximately 0.146 inches and then remains constant to rear end 45 to rear part 18. The opening through barrel 18 from region 53 to rear end 45 is large enough to receive the insulated test lead 24, which in the embodiment shown has a diameter of 0.144 inches. Region 53, with its substantially smaller diameter, thus functions also as a forward stop for test lead 24 and electrode 12.

In operation, electrode 12 is clamped by the action of tapered region 49 pressing against the tapered portion of collett 34 to such an extent that the two collett sections 39a, 39b forming its tapered portion deform or compress inwardly against electrode 12. Since slot 35 (and the other slot, not shown) extend longitudinally beyond the tapered portion of collett 34 and into the base portion thereof, and since tapered region 49 of the rear part contacts the tapered portion of collett 34 along its entire length, substantially uniform lateral pressure is applied along the entire length of the tapered portion of collett 34. This results in a substantially uniform displacement of both collett sections 39a and 39b along the entire length of the tapered portion of the collett. This virtually eliminates any possible pinch effect which may damage insulation layer 30.

When barrel 18 is rotated counterclockwise relative to tip 16, and thus moves longitudinally away from tip 16, the pressure on the tapered portion of collett 34 is reduced, permitting collett sections 39a, 39b to come back to their rest position. Electrode 12 may then be moved to a desired position relative to body 14 by the operator.

In its fully retracted position, the tip of forward end 20 of electrode 12 is approximately even with forward end 32 of tip 16 and the rear end 22 of electrode 12 is located approximately ¼ inch inward from rear end 45 of barrel 18. When electrode 12 is in its fully extended position, the tip of forward end 20 is approximately 2.75 inches from forward end 32, and rear end 22 thereof is approximately 3 inches inward from rear end 45.

When electrode 12 is placed in its desired position by the operator, usually somewhere between its fully extended and fully retracted positions, barrel 18 is rotated clockwise until tapered region 49 is in such a longitudinal relationship with the tapered portion of collett 34 that sufficient pressure is applied thereto to force the two collett sections 39a, 39b together against electrode 12, clamping it firmly in place.

In its fully retracted position, the embodiment shown is 5.25 inches long, which is a convenient length for storage, while in its extended position, it is approximately 8 inches long, which provides nearly three inches of electrode. The extended electrode permits the operator to reach remote circuit points without danger of damage to the circuit or harm to himself.

Although a preferred embodiment of the invention has been disclosed herein for purpose of illustration, it should be understood that various changes, modifications and substitutions may be incorporated in such embodiment. In particular, the detailed measurements of the embodiment shown can be changed or modified without altering the spirit of the invention, which is defined by the claims which follow.

What is claimed is:

1. A probe with an extendible electrode for use with electrical test apparatus, comprising:

an elongated, small diameter electrode which is electrically insulated along its length except for a small region about one end thereof to facilitate convenient operative contact with a selected point in a crowded electrical circuit, wherein said electrode is adapted to permit connection with a test lead which in turn is connectable to the electrical test apparatus;

an elongated housing for said electrode, wherein said housing comprises forward and rearward sections movable relative to each other, said forward section including (1) an opening at its front end at least the size of the electrode, through which said electrode extends, and (2) a slotted projection having an opening therein at its back end, through which said electrode also extends, wherein the opening in said projection decreases in diameter under pressure applied to the projection, said forward section extending a substantial distance forward of the front end of said rearward section, said rearward section having a front end portion which overlays and engages the slotted projection of said forward section, said rearward section extending a substantial distance beyond the back end of said forward section, the diameter of said rearward section being such that the rearward section may be easily held by an operator, the diameter of said forward section being smaller than that of said rearward section, so as to facilitate the use of the apparatus in crowded electrical circuit, wherein the front end portion of said rearward section engages the slotted projection of said forward section in such a manner that as said rearward section moves in one direction relative to the forward section, pressure increases on the projection, forcing it tight against said electrode, thereby holding said electrode in place, and further such that as said rearward section moves in the opposite direction relative to the forward section, pressure decreases on said projection, thereby releasing the projection from said electrode and permitting said electrode to be freely moved into a desired position relative to said housing, wherein the entire length of said rearward section and the portion of said forward section between its front end and the front end of said rearward section are exposed when said electrode has been clamped in place by the action of said rearward section on said projection of said forward section.

2. An apparatus of claim 1, wherein said rearward section has an interior wall which includes a first region which contacts said projection when said forward and rearward sections are engaged, said first region having such a configuration relative to the configuration of said projection that movement of the rearward section in one direction increases pressure on the projection, and movement of the rearward section in the opposite direction decreases pressure on said projection, wherein said projection includes at least two longitudinal slot-like openings therein, thereby forming at least two projection sections which are forced toward each other under pressure exerted by means of said first region of said interior wall as said rearward section is moved in the one direction relative to said forward section.

3. An apparatus of claim 2, wherein said projection includes a tapered portion and a base portion, and wherein said slot-like openings extend longitudinally the entire length of said tapered portion and into a part of said base portion, such that, as external pressure is applied substantially uniformly along said tapered portion by means of said first region of said interior wall, the two projection sections are pressed together substantially uniformly along their lengths.

4. An apparatus of claim 1, wherein said tapered portion of said projection is substantially circular in lateral cross-section, and wherein said first region of said interior wall is also substantially circular in lateral cross-section and is sufficient in length to contact said tapered portion along the entire length thereof, both when said tapered portion is clamped about said electrode and when it is released therefrom.

5. An apparatus of claim 4, wherein the tapered portion and said first region both have approximately the same taper within the range of 12° to 30°.

6. An apparatus of claim 5, wherein said forward and rearward sections of said housing both include a threaded portion, permitting a threaded engagement therebetween, thereby permitting controlled movement of said forward section relative to said rearward section and hence controlled movement of said first region of said interior wall relative to said tapered portion of said projection, thus increasing or decreasing pressure on said tapered portion.

7. An apparatus of claim 6, wherein the material comprising said electrode is corrosion resistant and is capable of retaining a sharp point for an extended period of time.

8. An apparatus of claim 1, wherein said interior wall includes a second region located just to the rear of said first region, said second region having a diameter which is smaller than the preceding and succeeding regions of said interior wall and just slightly larger than the cross-sectional dimension of said electrode, such that lateral movement of said electrode in said housing is substantially prevented.

9. An apparatus of claim 1, wherein said interior wall includes a third region positioned slightly forward of said first region, said third region having a smaller diameter than said forward section and thus acting as a rear stop therefor.

10. An apparatus of claim 1, wherein said forward section includes a circumferential ring of material at the very front end thereof, which projects away from said forward section at substantially a right angle to the longitudinal dimension thereof, providing a restraint for the hand of the operator.

* * * * *

UNITED STATES PATENT AND TRADEMARK OFFICE
CERTIFICATE OF CORRECTION

PATENT NO. : 4,210,863
DATED : July 1, 1980
INVENTOR(S) : Bill Hunt et al

It is certified that error appears in the above-identified patent and that said Letters Patent are hereby corrected as shown below:

Claim 4, line 1, the numeral "1" should be --3--.

Signed and Sealed this

Second Day of September 1980

[SEAL]

Attest:

SIDNEY A. DIAMOND

Attesting Officer  Commissioner of Patents and Trademarks